United States Patent [19]

Sommer et al.

[11] Patent Number: 4,500,901
[45] Date of Patent: Feb. 19, 1985

[54] THYRISTOR HAVING N+- MAIN AND AUXILIARY EMITTERS AND A P+ RING FORMING A P+N+ JUNCTION WITH THE MAIN EMITTER

[75] Inventors: Karl H. Sommer, Belecke; Alois Sonntag, Mulheim; Wolfgang Pikorz, Belecke, all of Fed. Rep. of Germany

[73] Assignee: Licentia Patent-Verwaltungs-G.m.b.H., Frankfurt am Main, Fed. Rep. of Germany

[21] Appl. No.: 277,322

[22] Filed: Jun. 25, 1981

Related U.S. Application Data

[63] Continuation of Ser. No. 54,894, Jul. 5, 1979, abandoned.

[30] Foreign Application Priority Data

Jul. 13, 1978 [DE] Fed. Rep. of Germany ....... 2830735

[51] Int. Cl.³ ............................................. H01L 29/74
[52] U.S. Cl. ...................................... 357/38; 357/13; 357/51; 357/86
[58] Field of Search .................. 357/38, 86, 51, 13

[56] References Cited

U.S. PATENT DOCUMENTS

| | | |
|---|---|---|
| 3,337,782 | 8/1967 | Todaro, Jr. . |
| 3,577,046 | 5/1971 | Moyson ................................. 357/38 |
| 3,671,821 | 6/1972 | Nakata et al. ......................... 357/38 |
| 4,053,921 | 10/1977 | Jaecklin et al. ....................... 357/38 |
| 4,223,332 | 9/1980 | Sittig ..................................... 357/38 |

FOREIGN PATENT DOCUMENTS

| | | |
|---|---|---|
| 2840 | 7/1979 | European Pat. Off. . |
| 2247006 | 5/1974 | Fed. Rep. of Germany ........ 357/38 |
| 2198265 | 3/1974 | France . |
| 2207363 | 6/1974 | France . |

OTHER PUBLICATIONS

Hartman, "Improvement of Thyristor Turn-on by Calculation of the Gate Cathode Characteristic before Injection," IEEE Transactions on Electron Devices, vol. ED-23, No. 8, Aug. 1976, pp. 912-917.

Kokosa et al., "Design Criteria for Amplifying Gates in Triode Thyristers," Technical Digest 1974 International Elect. Devices Meeting, Dec. 9-11, 1974, Washington, D.C. IEEE (New York) 1974 pp. 431-434.

Primary Examiner—Joseph E. Clawson, Jr.
Attorney, Agent, or Firm—Spencer & Frank

[57] ABSTRACT

A thyristor with an amplifying gate including a silicon semiconductor body having n+ conductive main and auxiliary emitters at the cathode side, wherein a p+ zone is formed in a region of the p control base zone adjacent the surface of the semiconductor body between the auxiliary emitter zone and the main emitter zone. The p+ zone contacts the edge region of the main emitter zone which faces the auxiliary emitter zone, and preferably projects into the edge region, and forms a p+n+ junction with the main emitter zone. Also, the p+ zone is laterally spaced from and does not contact the n+ auxiliary emitter zone.

14 Claims, 11 Drawing Figures

THYRISTOR HAVING N+- MAIN AND AUXILIARY EMITTERS AND A P+ RING FORMING A P+N+ JUNCTION WITH THE MAIN EMITTER

CROSS-REFERENCE TO RELATED APPLICATION

This application is a continuation of applicants' co-pending U.S. application Ser. No. 54,894, filed July 5, 1979 now abandoned.

BACKGROUND OF THE INVENTION

The invention relates to a thyristor with amplifying gate including a silicon semiconductor body and n+ conductive emitters at the cathode side. The invention further relates to a method for making such a thyristor.

Thyristors with internal firing amplification, usually called thyristors with amplifying gate, are used instead of the much more complicated firing pulse generators in order to effect firing of power thyristors with as high a control current as possible.

In thyristors with amplifying gate, an auxiliary thyristor is integrated into the semiconductor body. This auxiliary thyristor is initially fired with a low control current. The load current of the auxiliary thyristor, which is obtained from the load circuit and not from the control circuit, then acts as a high control current for firing the main thyristor. Within a short period of time, the latter takes over the load current from the auxiliary thyristor and protects the auxiliary thyristor against destruction due to overload. This transfer of control increases the size of the primarily fired cathode surface of the main thyristor which can be given relatively large dimensions. This reduces the turn-on power loss of the thyristor and the permissible current rise characteristic $di/dt_{crit}$ is increased compared to that of the conventional thyristor without a structure incorporating internal firing amplification.

When designing a thyristor with an amplifying gate, suitable measures must be taken to assure that the auxiliary thyristor will fire before the main thyristor in any case. If this does not occur, the main thyristor will receive a weak current, will fire irregularly on small surface regions and may be destroyed by thermal overloads in the initially fired channels.

With correct dimensioning of the auxiliary thyristor it is assured that its permissible load current always provides a sufficient transfer of control to uniformly fire the main thyristor. The edge region of the main emitter facing the auxiliary emitter can therefore be given relatively large dimensions without having to impress a high external control current so as to uniformly fire the entire edge region of the main cathode.

Various solutions for this problem have been published in literature. The criteria for dimensioning a thyristor with amplifying gate were given by R. A. Kokosa and E. D. Wolley, in IEEE, Intern. Electr. Dev. Meeting, 1974, pages 431–434. A typical thyristor with amplifying gate is shown in FIG. 1. In this component, the semiconductor layers 6, 8, 9 of alternating conductivity type (p,n,p+) and the metallic anode contacts 10 support the control electrode 4, the metallic contact 7 of the auxiliary emitter 1 as well as the metallic cathode contact 5 of the main emitter 2. The main emitter 2 is provided with several short-circuiting holes 11. Decisive for the operation of the amplifying gate are the resistances of the trigger zone 6 between control electrode 4 and auxiliary emitter 1, $R_{gp}$, underneath the auxiliary emitter 1, $R_p$, between the auxiliary emitter 1 and the main emitter 2, $R_{pm}$, and underneath the edge of the main emitter 2 and the first short-circuiting hole 11, $R_m$. These resistances are shown in dashed lines in FIG. 1. An equivalent circuit diagram for such a thyristor is shown in FIG. 2 according to the data given by Victor A. K. Temple and Armand P. Ferro, in IEEE Trans. Electr. Dev., Vol. ed-23, No. 8, August 1976, page 893, in which the control electrode is marked G and the cathode is marked K.

In the state before turn-on ($I_A \approx 0$; $I_G = I_K$) the control current $I_G$ flows laterally through the resistors of the p-conductive trigger zone 6. It produces a voltage drop $V_p$ across resistor $R_p$ and a voltage drop $V_m$ across the lateral base resistor $R_m$. When $V_p$ or $V_m$ reach a value of about 0.7 V (at room temperature) and under usual doping conditions, that thyristor stage will fire at which 0.7 V appears first. Consequently, an amplifying gate is designed correctly, if the following always applies:

$$V_p > V_m.$$

The prior art solutions are only based on the fact that this is assured by the appropriate setting of $R_p$ and $R_m$, i.e. the geometric dimensions are selected so that $$R_p > R_m$$

applies. $R_p$ can be increased by increasing the lateral expanse of the auxiliary emitter 1 or by diffusing the n+ zone of the auxiliary emitter 1 deeper and thus decreasing the conductivity of the p zone below this n+ zone 1. A further known measure aiming at reducing $R_m$ resides in the fact that the first short-circuiting holes 11 in the n+ region of the main emitter 2 are placed very close to the edge of the main emitter 2 facing the auxiliary emitter 1 and the short-circuiting holes 11 are given a relatively large diameter.

All known measures for obtaining a greater voltage drop underneath the auxiliary emitter 1 than under the main emitter 2 have drawbacks with respect to the dynamic properties of the thyristors, the critical voltage rise rate du/dt and the critical current rise rate di/dt as well as the recovery time $t_q$.

If, for example, the lateral expanse of the auxiliary emitter 1 is increased and the spacing between the main emitter edge and the first short-circuiting hole 11 in the main emitter 1 remains the same, the resistance $R_p$ will increase compared to $R_m$. Although this has the result that the auxiliary thyristor always fires before the main thyristor, there do exist the drawbacks which will be explained in connection with FIG. 3. The reference numerals of FIG. 3 correspond to those of FIG. 1. When a voltage is applied across the center pn junction between layers 6 and 8, a homogeneous shifting current of holes flows vertically out of the developing space charge zone toward the n+ emitter. The current density of this hole current is constant over the entire surface of the pn junction. Its absolute magnitude is determined by the voltage rise characteristic du/dt.

It corresponds to the state of the art to select the short-circuiting density in the main emitter 2 in such a manner that with the desired voltage rise characteristic all holes flowing under the region of the main emitter 2 are conducted away via the short-circuiting points 11 without producing an injection of electrons from the main emitter 2.

In the area of the thyristor which does not lie underneath the shorted main emitter 2, the hole current flows out of the developing space charge zone at the same vertical current density as underneath the main emitter. In contradistinction of the conditions underneath the main emitter 2, in this region the holes cannot flow out through shorting channels since the auxiliary emitter 1 is not connected to the external voltage source. The entire hole current from this area must flow away laterally through the p trigger or control base zone 6 to the first shorting holes 11 of the main emitter 2. The lateral current density then grows continuously from control contact 4 toward the main emitter 2, which is shown in FIG. 3 by an increase in the number of arrows symbolizing the current density. The current which is summed up to the outer edge of the auxiliary emitter is marked $I_p$, the current entering underneath the main emitter is marked $I_m$.

A large lateral expanse of the axuiliary emitter 1 always results in a large lateral hole current. Thus, with a higher voltage rise characteristic du/dt, or load, the fact that the recovery time $t_q$ is not reached will quickly result in exceeding the critical voltage of 0.7 V due to the voltage drops $I_p \cdot R_p$ across $R_p$ or $I_m \cdot R_m$ across $R_m$, respectively, i.e. as a result of the lateral hole current, the thyristor switches too early although it did not receive a control current.

Similar drawbacks, particularly in the blocking behavior of the thyristor, result if the increase in $R_p$ is set by way of a greater depth of the auxiliary emitter 1, i.e. if, for example, the n+ zone of the auxiliary emitter 1 is diffused deeper into the p zone 6 and thus the conductivity of the p zone 6 underneath this n+ zone is reduced. Although this thyristor will always fire first in the auxiliary emitter 1, it has no better du/dt and $t_q$ values, if the length of the inner edge of the main emitter (which is set by the required di/dt) is the same, than the thyrsitor with a laterally expanded auxiliary emitter. The product $I_m \cdot R_m$ is not changed by this measure, i.e. the thyristor fires at the same values of the lateral hole current $I_m$ as the previously discussed thyristor with laterally expanded auxiliary emitter.

Instead of increasing the resistance $R_p$ in the region below the auxiliary emitter 1, measures have also become known to reduce the resistance $R_m$ in the area of the main emitter 2. This is accomplished in that the first shorting holes 11 in the n+ region of the main thyristor 2 are placed very close to the edge facing the auxiliary emitter and the shorting holes 11 are given a large area. Such measures which are based on increased shorting of the main emitter 2, have the drawback, however, that the propagation speed of the turn-on process is reduced since only part of the edge of the main emitter 2 carries current at the beginning of the turn-on process, which results in greater turn-on losses.

Finally, there are diffused ohmic connections in the form of strip-shaped current paths or bars between the auxiliary and main emitter as described, for example in German Offenlegungsschrift [Application published without examination] No. 2,329,872. This is an ohmic current path disposed at the surface of the semiconductor body and not interrupted by a pn junction. With n+ emitters, this bar can thus only be designed as an n conductive region. This bar has the effect of a fixed resistor which connects the auxiliary and main emitters together. FIG. 4 is a top view of an embodiment with a bar 13. The reference numerals correspond to those of FIG. 1. The pn+ junction disposed underneath the auxiliary emitter contact 7 between the trigger zone 6 and the auxiliary emitter 1 has the reference numeral 12. The load current $I_{L1}$ flows through the bar 13, the load current $I_{L2}$ flows through the p conductive region 6. The load currents $I_{L1}$ and $I_{L2}$ are each components of the total load current $I_L$.

The operation of the n bar will be explained in detail with the aid of an equivalent circuit diagram as shown in FIG. 5. The resistors $R_p$, $R_m$ and $R_s$ are assumed to be selected so that it is assured that the auxiliary thyristor is always fired before the main thyristor. The load current $I_L$ of the auxiliary thyristor flowing through the anode A, as shown by the arrow, initiates the firing of the main thyristor.

$R_s$ indicates the resistance of the n bar 13; $R_{pm}$ and $R_m$ have the significance described above. The load current $I_L$ flowing in the auxiliary thyristor is thus divided into the two components $I_{L1}$ and $I_{L2}$ corresponding to the resistance relationships $R_s$ and $R_{pm} + R_m$ in the parallel circuit. The component $I_{L1}$ flows out, without having the effect of a control current for the main thyristor, via the bar 13 from the auxiliary thyristor to the main thyristor. Only the component $I_{L2}$ causes the main thyristor to fire.

In order to realize good du/dt and $t_q$ properties for the thyristor, $R_s$ must be selected to be small compared to $R_n + R_{pm}$ so that a sufficiently large portion of the capacitive hole current developing in the area not underneath the main emitter 2 can flow off via $R_s$ without producing an injection at the main emitter.

A low $R_s$ value leads to the following general drawbacks: when firing with control current, the auxiliary thyristor must carry a correspondingly higher load current before the main thyristor fires. The firing ineffective component $I_{L1}$ is enlarged and produces undesirable heating of the auxiliary thyristor. At higher frequencies this may lead to an overload and thermal destruction of the auxiliary system.

If this general drawback is accepted, there remain in addition further worsenings regarding the di/dt or du/dt behavior of the thyristor depending on its geometric design. In order to attain a low $R_s$, either one or a few broad bars can be applied, or a plurality of narrow bars. One broad bar would reduce the critical du/dt value since the bar acts as an n+ emitter and is not short-circuited. With many narrow bars, however, the main thyristor would fire, at the inner edge opposite the auxiliary emitter, only between the bars. This reduces the critical di/dt value. The bars thus have a similar effect at the inner edge of the main emitter as the shorting holes.

SUMMARY OF THE INVENTION

It is the object of the invention to provide a thyristor with amplifying gate which is distinguished by a short recovery time, low turn-on losses as well as high current and voltage rise rates (di/dt$_{crit}$, du/dt$_{crit}$) and in which it is assured that the auxiliary thyristor always fires before the main thyristor but which at the same time does not have the above-described drawbacks of the prior art solutions, such as laterally larger auxiliary emitters, shorting holes close to the edge of the main emitter or current conducting bars between the auxiliary and main emitters.

This is accomplished according to the invention in a thyristor with amplifying gate including a silicon semiconductor body and n+ conductive emitters on the cathode side in that a p+ zone is formed between the auxiliary emitter and the main emitter in a region of the p control base zone adjacent the surface of the semiconductor body. On the edge region of the main emitter facing the auxiliary emitter this p+ zone either contacts this edge region or projects into it and forms a p+n+ junction with the main emitter.

DETAILED DESCRIPTION OF THE PREFERRED EMBODIMENTS

Figure 1:
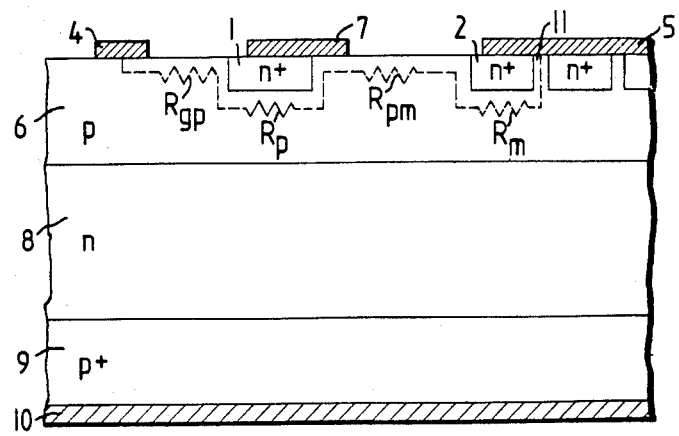
FIGS. 1 and 3 are partial cross-sectional views of thyristors with amplifying gates according to the prior art used in explaining the present invention.
Figure 2:
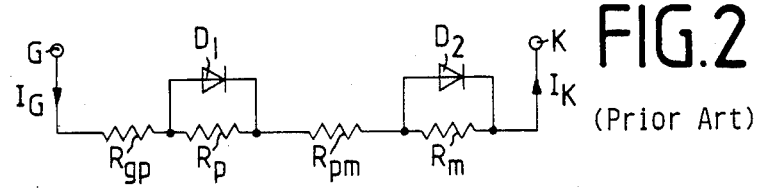
FIG. 2 shows the gate-cathode equivalent circuit of the device of FIG. 1.
Figure 3:
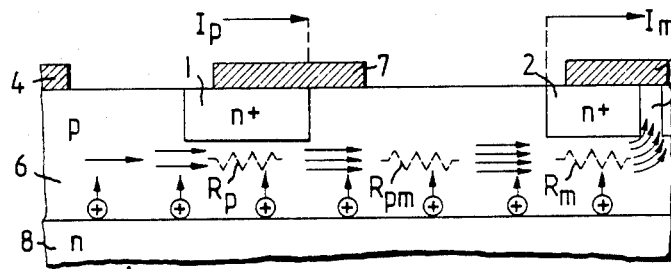
Figure 6:
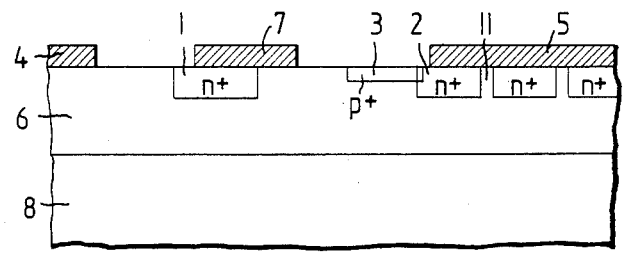
FIG. 6 is a partial cross-sectional view of a thyristor with an amplifying gate according to the invention.

FIG. 6 shows the basic embodiment of a thyristor with amplifying gate according to the invention. The reference numerals correspond to those of FIGS. 1 and 3. At the surface of the p control base zone 6, a further p+ zone 3 has been formed. The depth of the p+ zone 3 should be 10 to 100%, preferably 30%, of the depth of the pn+ junction between the p zone 6 and the main emitter 2, for example about 12μ. In order to assure a reliably uninterrupted production of the p+n+ junction of the p+ and n+ zones 3 and 2, respectively, the two zones preferably overlap as shown. Thus the p+ zone 3 should penetrate at least 0.1μ into the n+ zone. The p+ zone 3 extends preferably as far as possible in the direction toward the auxiliary emitter 1, without contacting auxiliary emitter 1, as is of advantage for the formation of a low resistance value $R_{pm}$. Small resistance values $R_{pm}$ produce low firing voltages. With the proper selection of the vertical depth of the p+ zone 3 it can be accomplished that the main thyristor fires at precisely the given load current of the auxiliary thyristor.

In a thyristor with central control electrode, the p+ zone 3 has a circular ring or annular shape. The concentration of impurities in the p+ zone 3 is assumed to lie at $N_A$ $10^{19}$ atoms×cm$^{-3}$, clearly above the original p doping with $N_A=10^{18}$ atoms×cm$^{-3}$. The difference between the impurity concentrations in the p+ zone 3 and in the n+ zone 2 must not be more than a factor of 10. If, for example, the p zone 3 has been produced with gallium and the n+ zone 2 with phosphorus or arsenic, then it is of advantage to produce the p+ zone 3 with boron to be able to easily set the desired impurity concentration.

The invention makes it possible to produce a p+n+ junction in the area of overlap at the zone interface. The n+ zone 2 which is doped, for example, with phosphorus in a concentration of $N_d=10^{21}$ atoms×cm$^{-3}$ remains n+ conductive even in the area of overlap, the p zone 6 which has already been doped with gallium is converted, by subsequent boron diffusion with $N_A=10^{20}$ atoms×cm$^{-3}$ in the intended region of the main emitter edge, into a p+ layer 3 of given depth. The P+n+ junction at the edge of the main emitter 2—i.e., a junction between semiconductor zones in which degeneration is present—exhibits a behavior which is completely different than that of the pn+ junction at the edge of the auxiliary emitter, particularly in the direction of flow.

Figure 7:
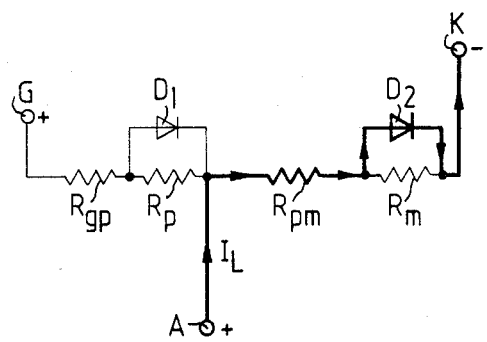
FIG. 7 shows the gate-cathode equivalent circuit of the thyristor of FIG. 6.

The operation of a thyristor according to the invention will be explained with the aid of FIG. 6 and the equivalent circuit diagram of FIG. 7 which corresponds to FIG. 6. In this arrangement, the condition $$V_p > V_m$$

which must be met for proper operation of the amplifying gate, i.e. that the auxiliary thyristor always fires before the main thyristor, is no longer set with the aid of the resistors $R_p$ and $R_m$ but by the directed change of the transmission characteristic of diode D2 compared to diode D1. The diode D1 is formed by the pn+ junction between the p trigger zone 6 and the n+ auxiliary emitter 1 and thus has normal transmission and injection properties (see FIG. 9). It has a relatively high threshold voltage of about 0.7 V which is determined by the doping conditions in the p and n+ regions.

The diode D2 is formed by the p+n+ junction between the highly doped zone 3 and the main emitter 2. The doping concentration on the p+ side is raised significantly compared to diode D1 by the additional diffusion. Diode D2 thus has a clearly lower threshold voltage than diode D1. Due to these good transmission properties of diode D2, the majority of the load current $I_L$ of the auxiliary emitter will flow off to the cathode K through this diode and D2 not through the resistor $R_m$. In the equivalent circuit diagram of FIG. 7, the preferred path of the load current has been emphasized by the bolder lines.

Figure 4:
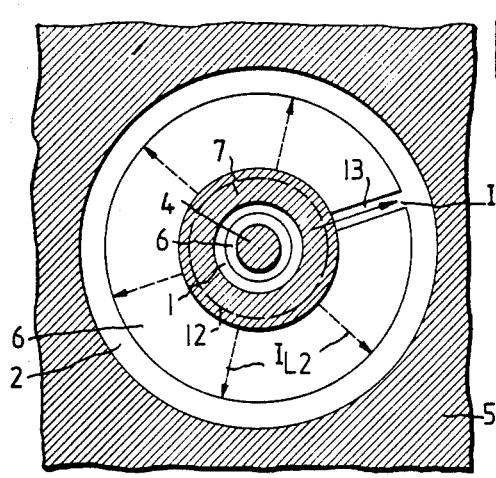
FIG. 4 is a partial plan view of a thyristor with an amplifying gate and conductive bars between the main and auxiliary emitters according to the prior art used in explaining the present invention.
Figure 5:
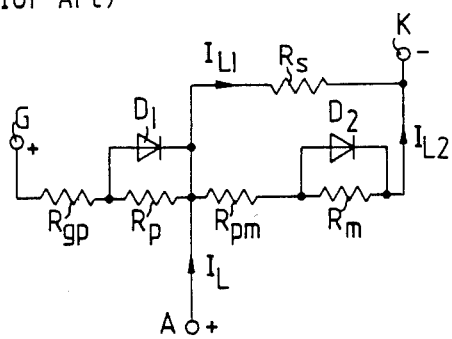
FIG. 5 shows the gate-cathode equivalent circuit of the device of FIG. 4.
Figure 8:
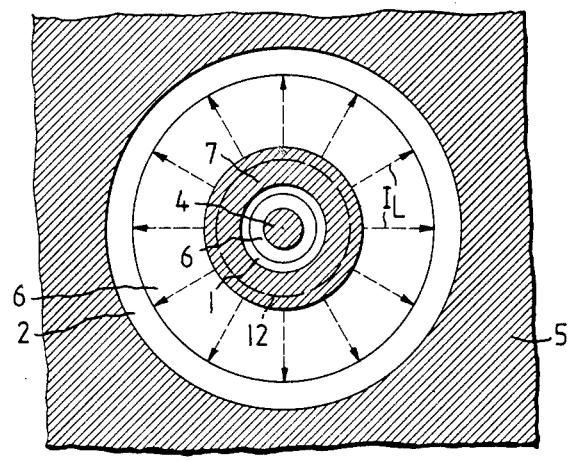
FIG. 8 is a partial plan view of the thyristor of FIG. 6.
Figure 9:
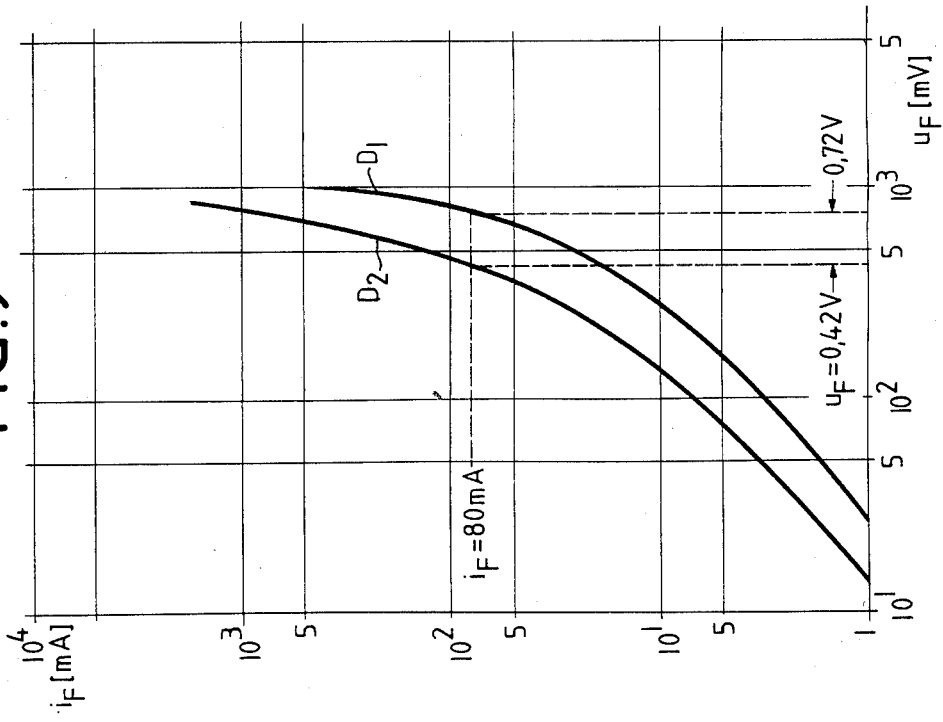
FIG. 9 shows transmission characteristics of the equivalent diodes D1 and D2 of FIG. 7.

The load current $I_L$ is not divided into two unequal components between the metal contact 7 of the auxiliary emitter 1 and the opposite edge of the main emitter 2 as is the case above with the bar arrangement of FIG. 4. Rather, the current is conducted, as shown schematically in FIG. 8, so that the current density along the periphery of the metal contact 7 of the auxiliary emitter 1 is the same everywhere. A local thermal overload is thus avoided. FIG. 9 shows the transmission characteristics of the diodes D1 and D2 as they were measured at a thyristor produced according to the method of the invention.

When a control current flows between the control or gate electrode 4 and the main emitter 2, the voltage $V_p$ drops at resistor $R_p$ and, when 0.7 V are exceeded, polarizes the diode D1 in the forward direction and fires the auxiliary thyristor. Firing of the main thyristor is still reliably excluded since the p+n+ diode D2 has not yet reached the critical voltage of 0.7 V. As can be seen in the diagram of FIG. 9, the critical value of 0.7 V is reached or exceeded in the diode D1 at a forward current of $i_F=80$ mA. With this current, the thyristor fires at the auxiliary emitter. With the same current, only a voltage of about 0.42 V is measured at diode D2. Thus, the main emitter cannot yet fire. With increasing load current $I_L$ from the auxiliary thyristor, the voltage drop across diode D2 becomes larger and when 0.7 V is reached at diode D2, the main thyristor fires. In the present example, this is the case only above 1000 mA.

The magnitude of the load current $I_L$ which must flow to reach 0.7 V at the diode D2, depends on the doping concentrations in the p+ and n+ zones 3 and 2, respectively. When the acceptor concentration in the p+ region 3 approaches the donor concentration in the n+ region 2, the forward voltage of the diode D2, i.e. the load current $I_L$ of the auxiliary thyristor required to fire the main thyristor, increases toward higher values.

With the invention it becomes possible for the auxiliary thyristor to always fire before the main thyristor under all operating conditions and independent of the selected geometry of the auxiliary and main emitters (i.e., independent of the relationship of $R_m$ to $R_p$). Moreover, compared to known arrangements, essential improvements result in the dynamic properties of the thyristor, such as current and voltage rise rate and recovery time, as will be described below.

Since the magnitude of $R_m$ no longer has a decisive influence, the shorting holes can be applied farther removed from the inner main emitter edge. Interference with the firing propagation during firing of the main thyristor is eliminated and the entire main emitter edge contributes to the conduction of current immediately after firing. This results in a high permissible voltage rise rate di/dt and lower turn-on losses.

The low forward voltage of the diode D2 also has an advantageous effect on the properties of the thyristor with respect to voltage rise rates du/dt and recovery time $t_q$, which are essentially determined by the dissipation of the capacitive hole current from the region not disposed below the main emitter. Even high capacitive hole currents up to several amperes are conducted through diode D2 toward the cathode without producing at the edge of the main emitter the voltage of 0.7 V which is required for firing. The dissipation of the hole current from the area of the thyristor not under the main emitter results in a reduction of the recovery time $t_q$. After previously being charged in the forward direction, the p and n bases 6 and 8, respectively, are filled with charge carriers. As is known, this charge carrier concentration must have dropped to a certain value before the thyristor can again take over a blocking voltage in the reverse direction with a given du/dt. With a given shorting density of the main and auxiliary emitters there exists a maximum permissible residual charge carrier concentration which together with the capacitive hole current will not lead to firing of the thyristor under the shorted emitter surfaces because of the returning voltage.

Since the capacitive hole current developing in the area of the control contact and of the auxiliary emitter always must flow toward the edge of the main emitter opposite the auxiliary emitter, there will develop at this point an excess hole density. In spite of sufficient shorting of the emitter surfaces this would lead to firing of the thyristor at the edge of the main emitter, which is usually called flipping, because the recovery time is not reached. In order to prevent this, one can either permit the residual concentration to continue to drop by waiting longer, i.e. an undesirable higher $t_q$, or the shorting in the edge region is increased. The latter results in the known drawbacks with respect to the current rise rate di/dt and the turn-on losses.

The solution according to the invention provides for flipping of the thyristor at the edge of the main emitter since the capacitive hole current flows off through the diode D2 without producing an injection.

Figure 10:
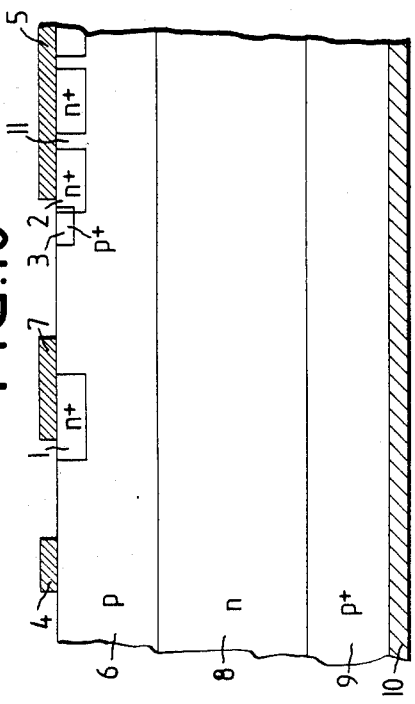
FIGS. 10 and 11 are partial cross-sectional views of specific embodiments of thyristors with amplifying gates according to the invention.

The thyristor according to the invention will be described once more with the aid of the partially schematic FIGS. 10 and 11.

Figure 11:
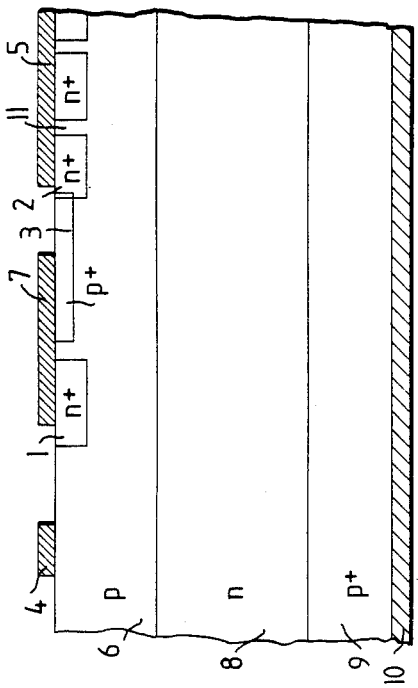

FIG. 11 shows the structure including layers 6, 8, 9 of alternating conductivity types (p, n, p+, respectively) on a metallic anode 10. On the surface of the p conductive layer 6 there are the control electrode 4, the metallic contact 7 of the auxiliary emitter 1 as well as the metallic cathode contact 5 of the main emitter 2. This main emitter 2 is provided with several shorting holes 11. According to the invention, a p+ zone 3 is provided between the auxiliary emitter 1 and the main emitter 2. The one edge region of the p+ zone 3 forms a p+n+ junction with the main emitter 2.

The expanse of the p+ layer in the direction toward the auxiliary emitter 1 is uncritical for the basic operation of the p+n+ diode as long as the p+ layer does not physically contact the n+ auxiliary emitter 1. The vertical expanse of the p+ layer 3 is determined by time and temperature during the p+ diffusion (e.g. boron). With increasing vertical expansion of the p+ layer 3, the forward voltage of the p+n+ diode drops, i.e. the load current $I_L$ of the auxiliary thyristor required to fire the main thyristor increases. Its upper limit is given by the power loss in the auxiliary thyristor. In practice it has been found that good dynamic properties ($t_q$, du/dt, di/dt) can be realized if the main thyristor fires only at currents of 1 to 5 A. The firing current of the auxiliary thyristor, however, lies at values between 50 and 100 mA as customarily used in practice. A thyristor according to the invention is thus distinguished by a high transmission ratio between the firing currents of the two stages.

In a further embodiment of the invention, which is explained in FIG. 11, the highly doped p+ zone 3 extends from the n+ region of the main emitter 2 to underneath the metal contact 7 of the auxiliary emitter 1. Thyristors with amplifying gate having a p+n+ diode and such a bridge of a p+ conducting region 3 between the main emitter 2 and the auxiliary emitter 1 have further advantages.

Due to the fact that the highly doped p+ zone 3 extends below the metal contact 7 of the auxiliary emitter 1, the resistance $R_{pm}$ becomes very low resulting in a low firing voltage. This is of interest particularly when thyristors are connected in parallel.

The method for producing a thyristor with amplifying gate according to the invention will be explained once more in detail with the aid of an embodiment.

The starting material selected is silicon of n-type conductivity, for example phosphorus doped silicon wafers having a diameter of 10 to 80 mm and a wafer thickness of 300 to 800 microns, which is adapted to the intended blocking capability. The magnitude of the basic doping with donors is about $1 \cdot 10^{13}$ to $1 \cdot 10^{14}$ atoms·cm$^{-3}$. For a time from 20 to 35 hours and at a temperature of about 1250° C., the silicon wafers are initially subjected to a gallium diffusion on both sides whereby the gallium penetrates about 45 to 70μ into the silicon and exhibits a concentration of $(2$ to $6) \cdot 10^{18}$ atoms·cm$^{-3}$. For a duration from 2 to 7 hours at 1220° C., the silicon wafers are then provided with an oxide layer by means of a treatment with moist oxygen and on this oxide layer the intended structure is produced with the aid of photolithographic or screen printing methods. After opening the oxide windows, phosphorus is diffused in for a period of 5 to 10 hours at a temperature of about 1260° C. in order to form the main emitter 2 and the auxiliary emitter 1, the concentration of the phosphorus in the emitter regions then being about $10^{21}$ atoms·cm$^{-3}$. The penetration depth of the phosphorus—with the same values for the main emitter and the auxiliary emitter—lies at 15 to 30μ.

The silicon wafers are now provided with a second oxide layer in moist oxygen for a period of about 2 hours at 1220° C., and are masked and opened for the acceptor diffusion as described above. The acceptor in this diffusion is preferably boron which penetrates at a temperature of 1250° C. for a duration of 2 to 8 hours to a depth of about 8 to 20μ. Since the concentrations of the p+ and n+ regions are to differ from one another by less than one order of magnitude, the diffusion of boron, with a phosphorus concentration of about $10^{21}$ atoms·cm$^{-3}$, must lead to values about $10^{20}$ atoms·cm$^{-3}$, in order for the p+n+ junction to receive the intended properties, as explained in detail above. The further process steps, i.e. the removal of the oxide layer, the metallization of the cathodes by vapor deposition of gold in a high vacuum, alloying the anode side onto a substrate of molybdenum via an aluminum intermediate layer, processing the edges and passivation as well as final installation in a housing are effected in a manner customary to the semiconductor art.

What is claimed is:

1. In a thyristor with an amplifying gate including: a silicon semiconductor body having three layer-like zones of alternating conductivity type between its two major surfaces with the control base zone on the cathode side of the device being p conductive, and having n+ conductive main emitter and auxiliary emitter zones formed in said p conductive control base zone adjacent one major surface of said semiconductor body, said auxiliary emitter zone forming only a pn+ junction with said p conductive control base zone; a metal control contact, a metal auxiliary emitter contact and a metal main cathode contact provided on said one major surface for said p conductive control base zone, said auxiliary emitter zone and said main emitter zone, respectively, said auxiliary emitter contact extending over and contacting a portion of the surface of said p conductive control base zone between said auxiliary and main emitter zones; and a metal anode contact provided on the opposite of said two major surfaces; the improvement comprising means for ensuring firing of the auxiliary thyristor before the main thyristor by a biasing voltage applied between said anode and said main cathode contacts and a control voltage applied to said control contact, said means including a p+ zone formed between said auxiliary emitter zone and said main emitter zones in a region of said p conductive control base zone adjacent said one major surface of said semiconductor body, said p+ zone contacting the edge region of said main emitter zone which faces said auxiliary emitter zone and forming a p+n+ junction with said main emitter zone, and said p+ zone being laterally spaced from and not physically contacting said n+ auxiliary emitter zone.

2. The thyristor defined in claim 1 wherein, at said one major surface, said p+ zone contacts the entire said edge region of said main emitter zone which faces said auxiliary emitter zone to form said p+n+ junction.

3. The thyristor defined in claim 1 or 2 wherein said p+ zone projects laterally into said main emitter zone to form said p+n+ junction.

4. The thyristor defined in claim 3 wherein said p+ zone projects into said main emitter zone by at least 0.1μ.

5. The thyristor defined in claim 1 wherein the depth of said p+ zone from said one major surface is 10 to 100% of the depth of said main emitter zone.

6. The thyristor defined in claim 5 wherein said depth of said p+ zone is 30% of the depth of said main emitter zone.

7. The thyristor defined in claim 1 or 2 wherein said thyristor has a central control contact, and said p+ zone has the shape of a circular ring.

8. The thyristor defined in claim 1 wherein the impurity concentration in said p+ zone is higher by at least one order of magnitude than the impurity concentration in said p conductive control base zone and differs from the impurity concentration in said n+ main emitter zone by less than one order of magnitude.

9. The thyristor defined in claim 8 wherein said n+ emitter zones have an impurity concentration of about $10^{21}$ atoms/cm$^3$ and said p+ zone has an impurity concentration of less than $10^{21}$ atoms/cm$^3$.

10. The thyristor defined in claim 1 or 8 wherein said p conductive zone is doped with gallium as the impurity material, and said p+ zone is doped with boron as the impurity material.

11. The thyristor defined in claim 1 or 2 wherein: said p+ zone extends laterally underneath said metal contact of said auxiliary emitter zone.

12. The thyristor defined in claim 1 or 2 wherein, with the same forward current, the diode formed by the pn+ junction between said p conductive control base zone and said auxiliary emitter zone always has a higher voltage drop than the diode formed by the p+n+ junction between said p+ zone and said main emitter zone.

13. In a thyristor with an amplifying gate including a silicon semiconductor body having three layer-like zones of alternating conductivity type between its two major surfaces with the control base zone on the cathode side of the device being p conductive, and having n+ conductive main emitter and auxiliary emitter zones which are disposed in said p conductive control base zone adjacent one major surface of said semiconductor body and form respective rectifying junctions with said control base zone which extend to said one major surface; a metal control contact, a metal auxiliary emitter contact and a metal main cathode contact provided on said one major surface for said p conductive control base zone, said auxiliary emitter zone and said main emitter zone, respectively, said auxiliary emitter contact extending over and contacting a portion of the surface of said p conductive control base zone between said auxiliary and main emitter zones; and a metal anode contact provided on the opposite of said two major surfaces; the improvement comprising means for ensuring firing of the auxiliary thyristor before the main thyristor by a biasing voltage applied between said anode and said main cathode contacts and a control voltage applied to said control contact, said means including a p+ zone formed between said auxiliary emitter and said main emitter zones in a region of said p conductive control base zone adjacent said one major surface of said semiconductor body, with said p+ zone contacting the edge region of said main emitter zone which faces said auxiliary emitter zone and forming a $p^+n^+$ junction with said main emitter zone and with the diode formed by the junction between said auxiliary emitter zone and said control base zone always having a higher voltage drop, for the same forward load current, than the diode formed by the junction between said maim emitter zone and said control base zone.

14. The thyristor defined in claim 13 wherein said $p^+$ zone is laterally spaced from and does not physically contact said $n^+$ auxiliary emitter zone.

* * * * *